United States Patent
Schell

[11] Patent Number: 6,148,846
[45] Date of Patent: Nov. 21, 2000

[54] WASTE LIQUID COLLECTION SYSTEM

[75] Inventor: Daniel Schell, San Jose, Calif.

[73] Assignee: Chemand Corporation, San Jose, Calif.

[21] Appl. No.: 09/270,284

[22] Filed: Mar. 16, 1999

Related U.S. Application Data

[60] Continuation-in-part of application No. 09/186,724, Nov. 4, 1998, Pat. No. 6,019,116, which is a division of application No. 08/777,681, Dec. 20, 1996, Pat. No. 5,832,948.

[51] Int. Cl.[7] .................................................... F04F 1/06
[52] U.S. Cl. ........................ 137/208; 137/209; 137/558; 137/571
[58] Field of Search ............................... 137/208, 209, 137/558, 571

[56] References Cited

U.S. PATENT DOCUMENTS

| | | | |
|---|---|---|---|
| 3,730,884 | 5/1973 | Burns et al. | 137/209 X |
| 5,148,945 | 9/1992 | Geatz | 137/208 X |
| 5,223,156 | 6/1993 | Maier | 137/571 X |
| 5,330,072 | 7/1994 | Ferri et al. | 137/208 X |
| 5,575,307 | 11/1996 | Martinitz et al. | 137/571 X |
| 5,590,678 | 1/1997 | Martinitz | 137/571 X |
| 5,954,078 | 9/1999 | Chiang et al. | 137/571 X |
| 6,009,892 | 1/2000 | Martinitz | 137/208 X |
| 6,026,837 | 2/2000 | Chen | 137/558 X |

*Primary Examiner*—Gerald A. Michalsky
*Attorney, Agent, or Firm*—Robert O. Guillot

[57] ABSTRACT

The waste liquid collection and transfer system includes at least one waste liquid transfer vessel that has a liquid input valve and a liquid output valve for controlling the flow of waste liquid therethrough. A pressurized gas liquid transfer system including at least one control valve is utilized to provide pressurized gas to said vessel to control the flow of liquid therefrom. A liquid drain line is engaged from the vessel to a liquid collection tank, and a liquid level alarm device is engaged to the tank to provide an alarm if the level in the tank becomes too high. An electronic system controller is engaged to the alarm device and to the various valves to control the flow of liquid throughout the system. When an alarm signal is received by the system controller the vessels are first emptied and thereafter allowed to become full, acting in this instance as additional waste liquid storage containers. When the vessels are full, the system controller shuts down the flow of liquid to the vessels. When the flow of liquid to the vessels is shut down by the system controller, it may then become necessary to shut down the chemical process equipment that generates the waste liquid.

17 Claims, 3 Drawing Sheets ic and other wet chemistry processes are utilized to fabricate integrated circuits upon silicon wafer substrates. The chemicals utilized in such processes must be carefully controlled to prevent the escape of dangerous fumes and the contamination of tools and personnel. Particularly, the escape of high levels of volatile organic compounds (VOCs) into the processing tool area is to be strictly avoided.

WASTE LIQUID COLLECTION SYSTEM

CROSS-REFERENCE TO RELATED APPLICATION

This application is a continuation in part of U.S. application Ser. No. 09/186,724, filed Nov. 4, 1998, now U.S. Pat. No. 6,019,116, entitled Liquid Transfer System, by Daniel Schell, which is a division of U.S. application Ser. No. 08/777,681, filed Dec. 20, 1996, now U.S. Pat. No. 5,832,948 issued Nov. 10, 1998, entitled Liquid Transfer System by Daniel Schell.

BACKGROUND OF THE INVENTION

1. Field of the Invention

The present invention relates generally to liquid collection and transfer system, and more particularly to liquid waste control systems for semiconductor fabrication processes.

2. Description of the Prior Art

The collection of depleted and contaminated chemicals from chemical processing equipment is an important facet of all manufacturing processes that utilize such chemicals. Where hazardous waste chemicals are not properly controlled, the manufacturing facilities that utilize the chemicals can be shut down, resulting in significant and expensive losses of material and equipment. Also, high levels of volatile organic compounds (VOCs) can be generated by waste chemicals, and the control of such VOCs is a significant problem. Therefore, a need exists for reliable, low VOC producing waste chemical collection systems, and particularly systems that have automated strategies to prevent system shutdown where serious alarm conditions occur.

Many automated liquid transfer systems exist, and generally, the utilization of such systems to transfer chemicals is known. However, where particularly sensitive chemical processing steps are being conducted, liquid transfer systems that utilize pumps and other reciprocating, vibration causing devices should be avoided. Liquid transfer systems, such as are described in U.S. Pat. Nos. 5,148,945, issued Sep. 22, 1992 to Gaetz, and 5,330,072, issued Jul. 19, 1994 to Ferri and Gaetz are then effectively utilized in such systems. However, even where such a liquid transfer system is utilized, an unacceptable high VOC production level can occur, and an alarm event, such as a full waste collection tank, can cause the entire chemical process to be shut down. A strategy, which allows the chemical processing system to continue in operation while the full waste tank alarm condition is solved is therefore desirable. A preferred embodiment of the present invention provides such an alarm condition strategy.

SUMMARY OF THE INVENTION

The waste liquid collection and transfer system includes at least one waste liquid transfer vessel that has a liquid input valve and a liquid output valve for controlling the flow of waste liquid therethrough. A pressurized gas liquid transfer system including at least one control valve is utilized to provide pressurized gas to said vessel to control the flow of liquid therefrom. A closed system liquid drain line is engaged from the vessel to a liquid collection tank, and a liquid level alarm device is engaged to the tank to provide an alarm if the level in the tank becomes too high. An electronic system controller is engaged to the alarm device and to the various valves to control the flow of liquid throughout the system. When a storage tank high liquid level alarm signal is received by the system controller the vessels are first emptied and thereafter allowed to become full, acting in this instance as additional waste liquid storage canisters. When the vessels are full, the system controller shuts down the flow of liquid to the vessels. When the flow of liquid to the vessels is shut down by the system controller, it may then become necessary to shut down the chemical process equipment that generates the waste liquid.

It is an advantage of the present invention that an efficient chemical waste collection and transfer system is provided.

It is another advantage of the present invention that an automated chemical waste collection and transfer system is provided that monitors and controls chemical waste from a plurality of processing tools.

It is a further advantage of the present invention that a chemical waste collection and transfer system is provided that monitors a plurality of detector and alarm conditions to facilitate the efficient collection and transfer of chemical wastes.

It is yet another advantage of the present invention that a chemical waste collection and transfer system is provided that includes an automated system controller to detect and respond to alarm causing events.

It is yet a further advantage of the present invention that a chemical waste collection and transfer system is provided that includes a system controller having an automated alarm response strategy that provides additional waste chemical storage in the event that the waste collection tank is full.

It is still another advantage of the present invention that a chemical waste collection and transfer system is provided having automatic response strategy in the event that a waste collection tank if full to provide additional time to cure the full tank condition prior to shutting down the chemical processing equipment.

It is still a further advantage of the present invention that a chemical waste collection and transfer system is provided having low VOC production.

It is yet another advantage of the present invention that a chemical waste collection and transfer system is provided that includes an off-site system controller feature that facilitates control of a plurality of waste collection systems from a single location.

These and other features and advantages of the present invention will become known to those skilled in the art upon reading the following detailed description of the invention which makes reference to the several figures of the drawing.

IN THE DRAWINGS

DETAILED DESCRIPTION OF THE PREFERRED EMBODIMENTS

In virtually all wet chemistry systems there is a need to efficiently remove waste chemicals that have been utilized by a tool or device. With particular regard to the semiconductor fabrication processing industry, many etching, cleaning and rinsing processes are conducted by various tools or devices during the fabrication of semiconductor chips. Chemicals that are utilized in the etching, rinsing and cleaning steps become spent and/or contaminated, and they then require removal and replacement with fresh, full strength chemicals. The efficient removal of the waste chemicals is an important functional component of the overall manufacturing process. Where the removal of the waste chemicals is disrupted, hazardous conditions can occur which can result in the shutting down of the semiconductor fabrication processing equipment, which can be a very expensive event. The present invention is a system for the efficient removal of waste chemicals that includes alarms and hazardous condition strategies that seek to prevent the shutting down of a fabrication process should the waste chemical collection system be disrupted. The overall system of the present invention is depicted in FIG. 1, and further details of the system are depicted in FIGS. 2, 3, 4 and 5.

Figure 1:
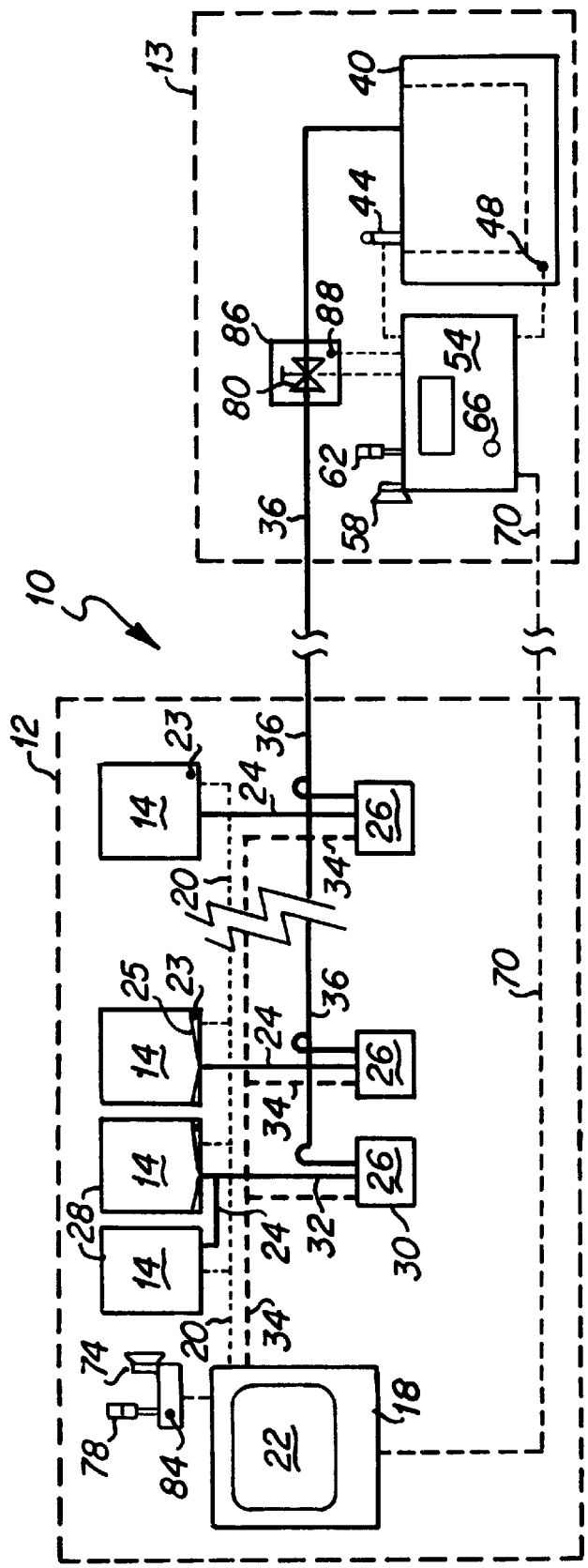
FIG. 1 is a diagram of the waste liquid collection system of the present invention.

FIG. 1 depicts a generalized chemical utilization system, such as a semiconductor wafer fabrication system having an interior fabrication area 12 and an exterior bunker area 13 for storage of waste chemicals. The fabrication area 12, includes a plurality of devices 14, termed "tools", each of which utilizes liquid chemical formulations in the processor step conducted by the tools 14. A computerized system controller 18 is electrically engaged by lines 20 to each of the tools 14 to receive signals therefrom and display or report the status of the tools 14 to an operator through a video display 20 and printable reports (not shown). Sensors, such as leak detectors 23 that detect leaks associated with liquid control trays of the tools 14, provide control signals to the computerized control system 18. A liquid drain tube 24 leads from each tool 14 to a solvent collection transfer unit 26. One or more tools 28 can be connected to a single transfer unit 30 through a shared drain tube 32. Each transfer unit 26 is electrically connected to the controller 18 through control lines 34. Under computer control, the transfer units 26 dispense the waste chemicals collected from the tools 14 to a drain line 36 that leads to a waste collection tank 40.

In a typical installation, though not at all necessary, the waste collection tank 40 is located in the external bunker area 13 that is disposed away from the fabrication area 12. The waste collection tank 40 preferably includes a waste liquid level sensing device 44 and a leak detecting device 48, each of which provide electronic signals to an external controller 54 located proximate the waste collection tank 40. The controller 54 may include an audio alarm 58, a visual alarm light 62 or other alarm providing mechanisms, as well as an emergency power off button 66. The external controller 54 is provided with an electronic communication means, such as line 70 to the system controller 18. The external controller 54 is not a necessary feature of the invention, and alternatively, the system controller 18 can be configured to handle the functions of the external controller, such as enabling the appropriate alarm devices upon the occurrence of a detected hazardous event. However, an external alarm system and power off button located at the bunker 13 are recommended. Additionally, an alarm system, including an audio alarm 74, a visual alarm light 78 or other alarm providing means, as well as an emergency power off button 84 should be included within the interior area 12. The drain line 36 is preferably provided with a shut off valve 80 that is operated by the external controller 54 or the system controller 18. The shut off valve 80 may preferably be enclosed in a valve box 86 which includes a leak detector 88 that is electronically engaged to the controller 54 or system controller 18, whereby leakage of the shut off valve 80 is monitored.

While various types of liquid collection and transfer devices can be utilized as the transfer unit 26 in the system, the preferred embodiment utilizes a liquid and transfer unit 26 that is similar to the liquid transfer system described in U.S. patent application Ser. No. 08/777,681, now U.S. Pat. No. 5,832,948, entitled Liquid Transfer System, the disclosure of which is incorporated herein as though set forth in full, and to which application priority is claimed. The preferred transfer unit 26 is depicted in FIG. 2 and next discussed.

Figure 2:
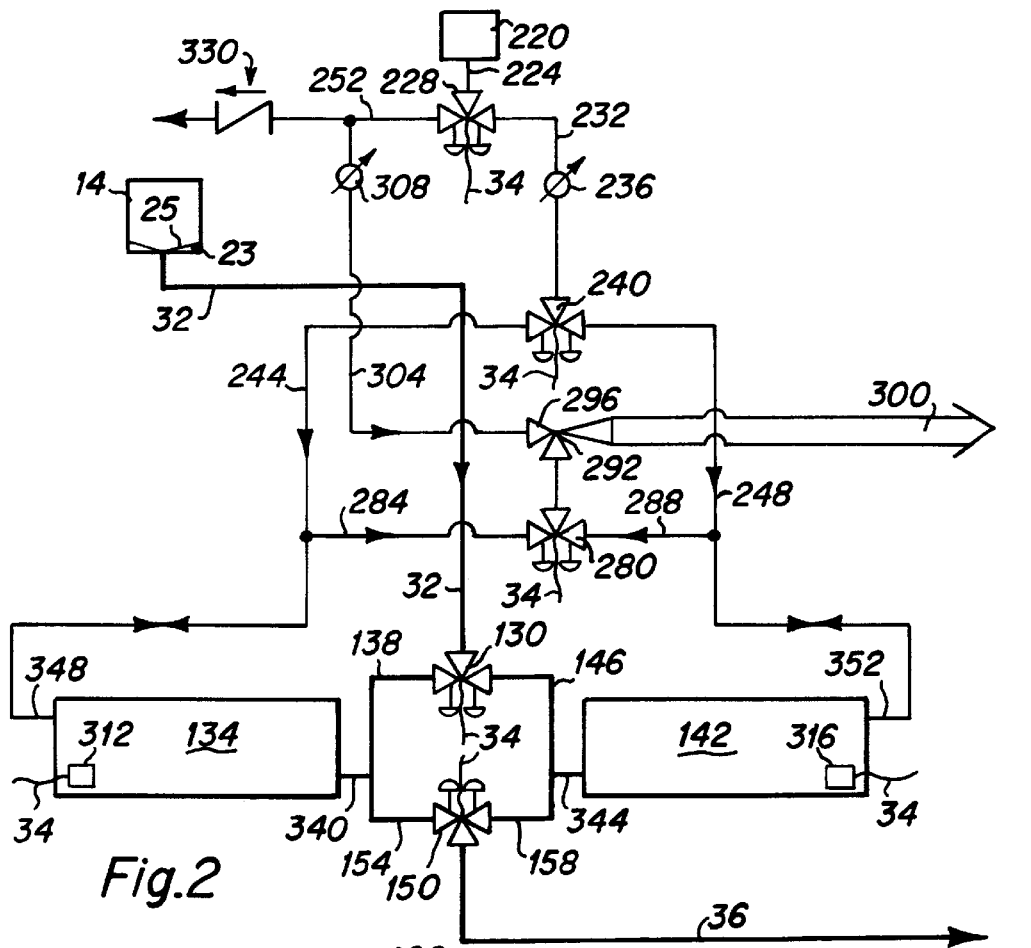
FIG. 2 is a waste liquid transfer device of the present invention.

FIG. 2 is a detailed depiction of a preferred liquid transfer system 26 of the present invention, wherein gas pipes are shown as a single line and liquid pipes are shown as a double line. As depicted in FIG. 2, a tool 14 is disposed in a vertically elevated position relative to two pressurizable liquid holding vessels 134 and 142. The liquid supply line 32 is engaged to the tool 14 to deliver liquid to the two vessels 134 and 142 through a 3-way valve 130. The valve 130 is connected to the system controller 18 by control line 34 and may be activated by the controller 18 to supply liquid to the first pressurizable liquid holding vessel 134 through line 138 or to the second pressurizable liquid holding vessel 142 through line 146. Liquid from vessel 134 is deliverable to a 3-way valve 150 through line 154, whereas liquid from tank 142 is deliverable to the 3-way valve 150 through line 158. Liquid from the valve 50 is delivered to the drain line 36. The valve 150 is connected to the system controller 18 by control line 34.

The flow of liquid from the vessels 134 and 142 is controlled by gas pressure, preferably utilizing a relatively inert gas such as nitrogen, although air or other gases may be used in various applications. As depicted in FIG. 2, nitrogen from a course 220 is fed through delivery line 224 to a 3-way valve 228 controlled by the system controller 18 through control line 34. In a first gating from valve 228, pressurized gas is fed through a line 232 that is controlled by a gas regulator 236 to a 3-way valve 240 controlled by the system controller 18 through control line 34. Pressurized gas can then be gated from valve 240 to vessel 134 through gas line 244 or to vessel 142 through gas line 248.

In order to fill tanks 134 or 142 with liquid, it is necessary to outlet any gas present in vessels 134 and 142 that is displaced by inletted liquid. To accomplish the outletting of gas from vessels 134 and 142, a 3-way valve 280 is engaged by gas lines 284 and 288 to lines 244 and 248 respectively. The 3-way valve 280 is controlled by the system controller 18 through control line 34 and may be connected to the suction orifice 292 of a venturi valve 296 which is connected to a gas exhaust 300. Pressurized gas to operate the venturi valve 296 is delivered through gas line 304 which is connected through a gas regulator 308 to pressurized gas line 252 that is connected to valve 228. Therefore, when valve 280 is opened it permits the outletting of gas from vessels 134 or 142 during the liquid filling of those tanks. Additionally, if the venturi valve 296 is activated, a suction force can be applied through valve 280 to facilitate the removal of displaced gas from vessels 134 and 142. It is therefore to be generally understood that when liquid is present in tool 14 and valve 130 is opened to either vessel 134 or 142 that the liquid will flow from tool 14 into a vessel 134 or 142. For gas control and safety reasons a gas release check valve 330 is engaged to gas line 252.

As alternating fill-empty process is preferably utilized to transfer liquid from the vessels 134 and 142 through valve 150 to drain line 36. Assuming vessel 134 is full of liquid, to transfer liquid from vessel 134, under control by the system controller 18 valves 228 and 240 are appropriately opened to cause pressurized gas to flow through line 244 into vessel 134, and valve 150 is opened to permit liquid to flow from vessel 134. When vessel 134 is empty, as determined by a liquid level sensor 312 that provides signals through control line 34 to the system controller 18, valve 240 is activated to cause pressurized gas to flow through line 248, into vessel 142. Simultaneously, valve 150 is operated to permit liquid to flow from vessel 142 into drain line 36. While liquid from vessel 142 is being emptied through drain line 36, valve 130 is opened to allow liquid from tool 14 to flow through line 138 to simultaneously cause liquid to fill vessel 134. When vessel 142 is nearly empty, as determined by a liquid level sensor 316 that provides signals through control line 34 to the system controller 18, valve 240 is activated to stop liquid flow therefrom. Thereafter when vessel 134 is full again, valve 240 is activated to cause pressurized gas to flow through line 244, to cause liquid to flow from vessel 134, with valve 150 having been appropriately activated to allow liquid to flow from vessel 134. While liquid flows from vessel 134, vessel 142 is filled. It is therefore to be understood that liquid can be transferred through drain line 36 by alternately filling and emptying vessels 134 and 142. Through appropriate control of the various valves of system 26 by the system controller 18, the liquid flow through drain line 36 can be accomplished. It is to be further appreciated that the liquid transfer system 26 does not use reciprocating pumps or other devices that cause a pulsating vibration. Rather, the liquid transfer delivery system 26 provides a gas pressure drain liquid flow that is very controllable and vibration free.

The system 10 includes control parameters for its various sensors and detectors that are monitored by the system controller 18 to create a monitored system. With regard to the pressure vessels 134 and 142 pre-set capacity parameters are established; that is, a pressure vessel is considered empty when its level sensor 312 and 316 respectively indicates that it is down to 15–20% of its capacity, and full when its level sensor 312 and 316 indicates that it is at 60–80% of its capacity. The waste collection tank is considered to be full or "HI" and requiring to be emptied when its liquid level sensor indicates that it is at approximately 70% of its capacity, and an upper HIHI alarm limit is set at approximately 80% of its capacity. Therefore, when the system is being operated, the pressure vessels 134 and 142 alternately fill and empty within their prescribed capacity limits, and the waste tank is monitored to be emptied when it reaches approximately 70% capacity.

Figure 3:
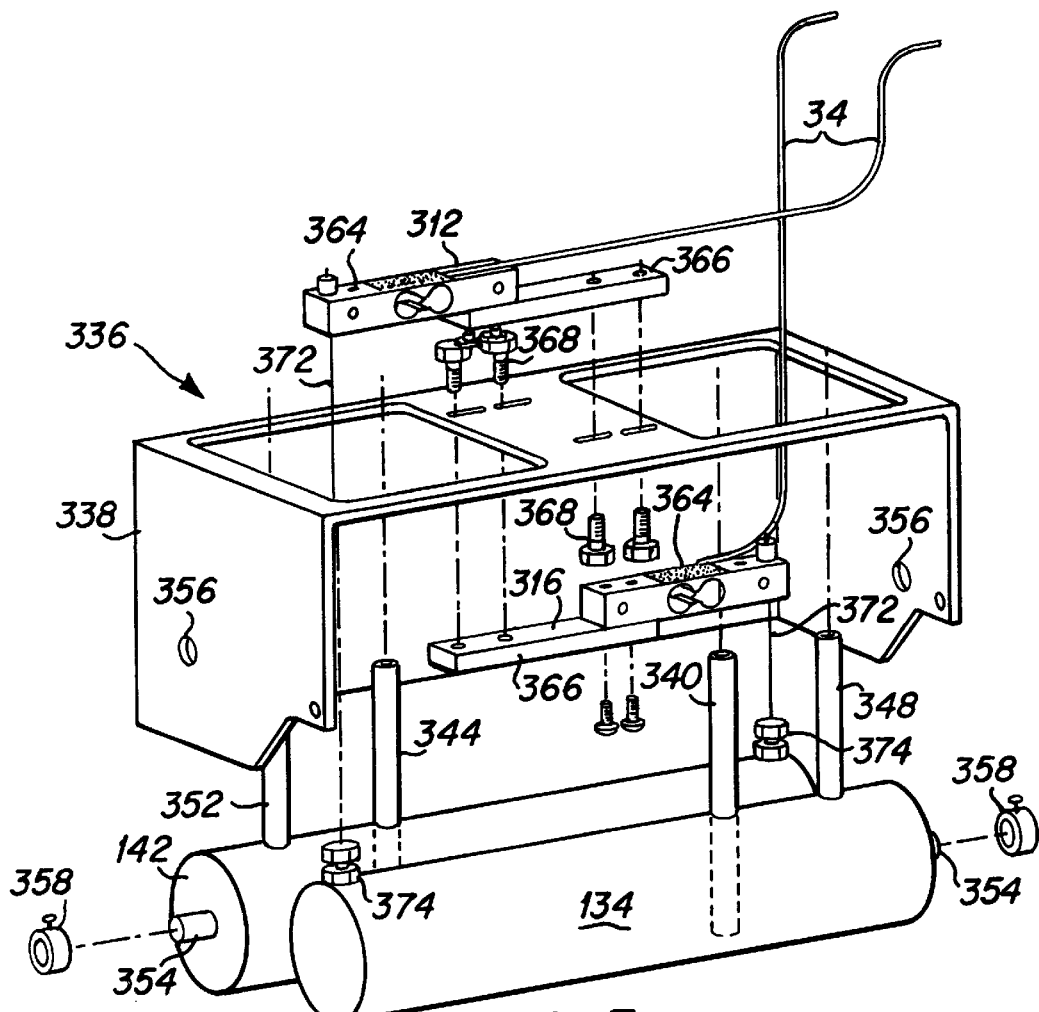
FIG. 3 is an exploded perspective view of a preferred pressure vessel assembly of the present invention.

A preferred pressure vessel assembly is depicted in FIG. 3, and is described briefly herein; a more detailed description is provide in U.S. patent application Ser. No. 09/239,460, entitled Pressure Vessel Isolation Carriage, by Kenneth Alan Johnson, filed Jan. 28, 1999, the disclosure of which is incorporated herein by reference as though set forth in full. The pressure vessel assembly 336 includes a housing 338 that holds the two pressure vessels 134 and 142. As depicted therein, the pressure vessels 134 and 142 have liquid in/out lines 340 and 344 respectively and gas in/out lines 348 and 352 respectively. Each pressure vessel 134 and 142 is preferably formed as a cylindrical tank that is disposed horizontally. A fulcrum member 354 projects from one end of each pressure vessel through a fulcrum hole 356 formed through housing 338, and a fulcrum lock 358 holds the fulcrum member 354 in a projecting position through the fulcrum 356. The liquid level sensors 312 and 316 each include a load cell 364 that is engaged to a load cell mounting bracket 366 that is mounted to the housing 338 utilizing two load cell mounting screws 368. A suspension cable 372 is engaged at one end to the load cell 364 and at the other end to an adjustable clamp 374 that is engaged to the end of the pressure vessel that is opposite the fulcrum 354.

It is therefore to be understood that each pressure vessel 134 and 142 is suspended from a load cell 364 at one end and supported by a fulcrum 354 at the other end. In this manner, measurements from the load cell 364 reflect the weight of the pressure vessels 134 and 142, which weight is directly related to the quantity of liquid within the pressure vessel. Electronic signals from the load cells are conveyed to the system controller 18 through electrical lines 34, and with some type of load cells an amplifier may be utilized within the signal path. The load cell measurement system must be calibrated to provide for meaningful results, and the calibration is part of the ongoing system operational procedures. Additionally, where an amplifier is utilized, electric signal drift may occur, which is solved by periodic automatic recalibration of the load cell system, as is well understood by those skilled in the art.

In the preferred embodiment of the present invention, the valving components that control the pressure vessels are preferably configured in a port array device, such as is described in copending U.S. patent application Ser. No. 09/177,856, entitled Fluid Handling Port Array, by Kenneth Alan Johnson, filed Oct. 23, 1998, the disclosure of which is incorporated herein by reference as though set forth in full. In the port array device, the three way valves 130, 150, 240 and 280 are replaced by separate 2-way valves that serve to open or close flow of liquids or gas to or from the particular pressure vessels, rather than routing the flow to or from one source to the other. However, the operational chambers of the pressure vessel assembly remain the same. Such a port array device has a minimal footprint, whereby the valve and the pressure vessel components of each of the transfer units 26 of the present invention require minimal space within a fabrication system for installation maintenance.

Various software and hardware related problems can potentially occur with the load cells and electrical signal amplifiers associated with them, as well as the system software and hardware. A preferred embodiment of the present invention includes alternative pressure vessel operation modes and recalibration modes for the liquid level sensor system. An important alternative pressure vessel operation mode is a timer mode. In the timer mode the fill-empty cycle of the pressure vessels is not controlled by the liquid level sensor. Rather, it is controlled on a timing basis. In this timer mode, each pressure vessel is alternatively emptied after a specific time period, such as 15 minutes, while the other pressure vessel alternately is filling. It is necessary to utilize such a mode if the liquid level sensors electronically drift or other software/hardware problems occur, because the timer mode will permit the waste removal system 10 to continue operation, which is of the utmost importance in allowing the semiconductor fabrication to continue operation. As indicated hereabove, it is a permanent concern that a semiconductor processing line not be halted because a problem exists in the waste collection system. The timer mode therefore is initiated where a problem occurs in the liquid level sensor system of the system 10.

The automated aspects of the system 10 allow for fully manual control of the pressure vessels should the need arise. Specifically, each valve of the system is operable through the system control lines 34 engaged between the system controller 18 and the individual valve and sensor components. Therefore, the system operator can monitor the liquid level in each pressure vessel through signals received from the liquid level sensors. The operator can manually initiate a pressure vessel exhaust cycle, as well as a second pressure vessel intake cycle. These exhaust and intake cycles are conducted, as discussed hereabove, by signals from the system controller that open and close the appropriate valves for liquid output and liquid input to the respective pressure vessels.

Figure 4:
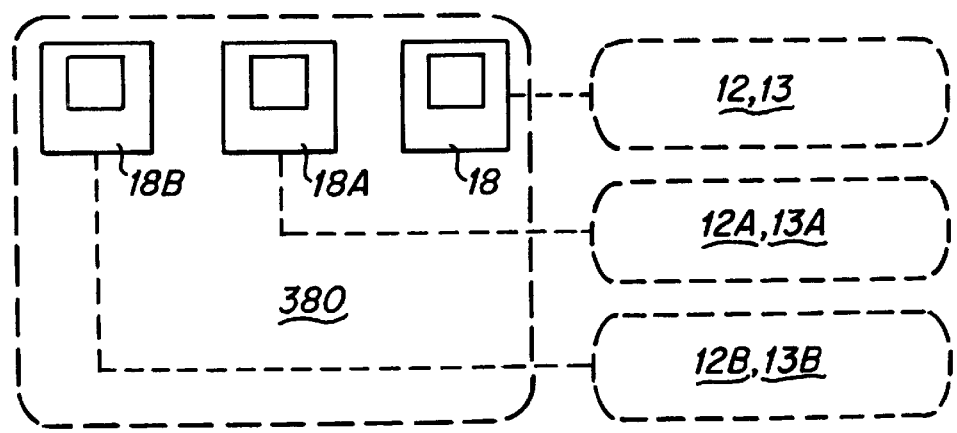
FIG. 4 depicts an off-site system controller waste collection system.

A further significant feature of the system 10 is the capability of the system controller 18 to be operated remotely within a facility, and even at a site that is remote from the overall chemical processing system which generates the waste liquids that it collects. Specifically, where the chemical system is a semiconductor fabrication line, the line will typically be located in a clean room facility 12, and significant portions of the waste collection system 10 will therefore be located within the facility 12, as depicted in FIG. 1. However, it is not necessary for the system controller 18 to be located within the clean room facility 12; rather, the system controller 18 can be remotely disposed in a more accessible, non-clean room environment within the fabrication facility. Additionally, the system controller 18 can be located off site, as depicted in FIG. 4. In this operational configuration, a single off-site location 380 is staffed with expert system operators that monitor one or more system controller 18, 18A, 18B located at the off-site location 380, such that control of a plurality of individual fabrication line waste control systems 12,13, 12A,13A, 12B,13B, which may be located at several different sites, is achieved. The normally operating systems 10 produce minimal monitoring functions, whereas an alarm condition occurring at a particular site receives immediate expert attention. Particular pressure vessel level sensor conditions can be monitored and corrected, and waste tank levels can be likewise monitored and corrective steps taken in the event of alarm situations. Additionally, the computerized system controller 18 can function in a preventive maintenance capacity. That is, particular load cells and other components can be monitored for excessive electronic drift and other parameters that indicate a significant likelihood of future failure. Such components can be identified and replaced by the system operator riot to actual failure, thus facilitating proactive system maintenance which eliminates potential problems before they become real problems.

Alarm conditions of the system 10 include a waste tank leak, valve box leak, a tray leak and waste tank HIHI condition. Each of these alarm conditions is monitored with appropriate sensors and alarm providing devices. A significant system control question arises where an alarm event occurs, because it is not desirable, but rather a last resort, to stop the liquid flow from the tools 14 and thereby shut down the fabrication system due to an alarm condition in the waste transfer system. The present invention includes alarm system strategy that seeks to control the waste transfer system during an alarm situation to provide additional time for the operators to correct the alarm condition without shutting down the fabrication system.

Specifically, where a waste tank HIHI alarm is received, indicating that the waste tank has reached 80% of its capacity, the system controller reacts to provide a maximum liquid storage capacity within the pressure vessels. In this control situation, valves 130, 150, 228, 240 and 280 are activated by the system controller 18 such that both pressure vessels 134 and 142 are immediately emptied by gas pressure. Typically, this combined emptying will release approximately one pressure vessel quantity of liquid due to the generally full/empty ongoing status of the pressure vessels. The waste tank 40 is sufficiently large that the additional liquid from the emptying of the two pressure vessels 134 and 142 will not cause it to overflow because it reached its alarm stage at 80% of capacity, and the additional fluid from the pressure vessels will not place it over 100% capacity. Thereafter, following their emptying, the tow pressure vessels are then utilized as a pair of emergency waste storage canisters. That is, further fluid from the tools 14 is fed to one pressure vessel 134 and then the other pressure vessel 142. Neither pressure vessel is emptied, and when both pressure vessels reach 90% capacity there is no further remaining storage for the incoming waste liquid, and the fabrication system tools 14 must finally be shut down. However, in the additional time that is has taken to fill the two pressure vessels, the system operators will have had the further opportunity to empty the waste tank 40, whereupon the normal operation of the system can be reestablished by venting one pressure vessel 134 and allowing it to commence filling while alternately venting the other pressure vessel 142, thereby to reestablish the alternate filling and emptying of the two pressure vessels in the normal system operation procedure.

Figure 5:
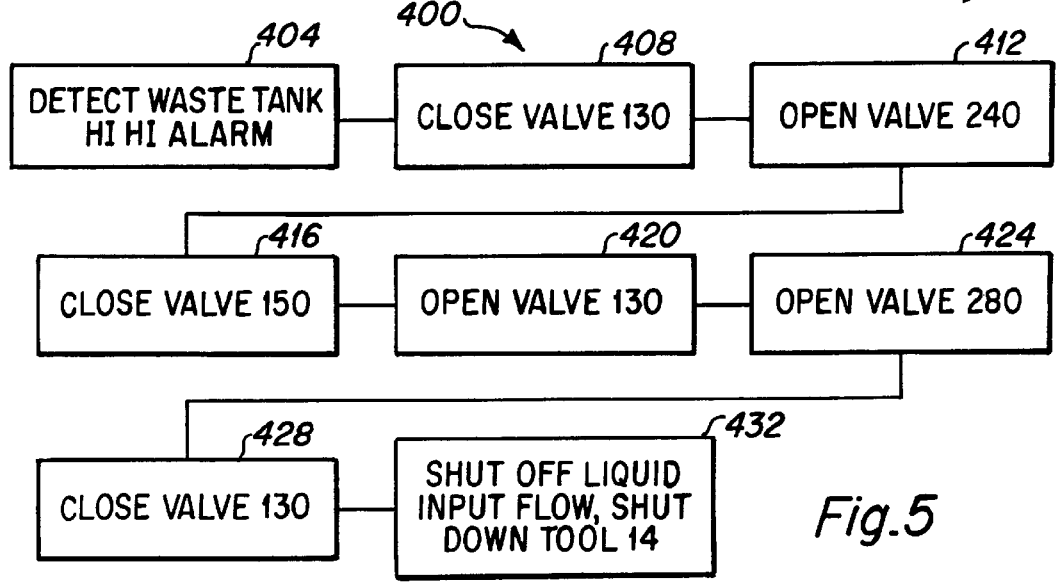
FIG. 5 is a flow chart of a waste tank alarm control sequence of the present invention.

An exemplary control sequence 400 of the system controller 18 for the waste tank HIHI alarm is depicted in FIG. 5. The control sequence 400 commences with the detection of a waste tank HIHI alarm signal 404 that is transmitted to the system controller 18. The system controller 18 causes appropriate audible or visual alarms to be activated and commences a control sequence to empty 408 both pressure vessels 134 and 142. The sequence is initiated by closing valve 130 and opening gas pressure valve 240 to complete the emptying 408 of whichever pressure vessel 134 or 142 may currently be in an emptying phase. If neither vessel 134 or 142 is currently being emptied, then one of the vessels is currently being filled. The system controller then causes valve 240 to open 412 to empty the pressure vessel that is currently being filled through valve 150. Thereafter, valve 150 is closed 416 and valve 130 is opened 420 and valve 280 is opened 424 to fill first one pressure vessel and then the other pressure vessel. Thereafter, when both pressure vessels 134 and 142 are full, valve 130 is closed 428 to stop the flow of waste liquid from the tools 14 into the full pressure vessels 134 and 142, and the system controller 18 then sends signals 432 to shut down the tools 14. While a particular valve control sequence has been shown in FIG. 4 and described in detail, it is within the contemplation of the inventors that other control sequences can be utilized to accomplish the basic results of utilizing the pressure vessels 134 and 142 as waste liquid storage containers to obtain additional time for the operators to cure the waste tank HIHI alarm situation.

Other alarm conditions of the system, such as waste tank leak, valve box leak and tray leak are monitored by sensors 48, 88 and 23, respectively which provide signals through control lines 34 to the system controller 18. An alarm event in any of these systems is a serious event as it indicates that potentially hazardous chemicals are escaping from a controlled environment, and the condition must be addressed by the operators promptly. Each of these alarm events occurs from an equipment or system failure, and is therefore an unusual, generally non-human error event. However, the alarm caused by a waste tank HIHI event is strictly human error related, in that is results from an operating failure of the system operator to cause the waste tank to be emptied when it reached 70% capacity. Therefore, the alarm management strategy described above with regard to the waste tank HIHI alarm is designed to react to operator, human error in the system operation. Other system alarms, while certainly significant, have a lesser degree of likelihood of occurence as they are generally not human error generated.

An important feature of the present invention is that it produces significantly less volatile organic compounds (VOCs) than some currently utilized waste collections systems. With reference to FIGS. 1 and 2, the system 10 is basically a closed system with regard to the escape of VOCs. That is, as compared with many currently used systems, there is no exhaust system engaged to the drain pipe 36 as it leads from the pressure vessels 26 to the waste tank 40. Typically, a significant quantity of VOCs is generated in a waste line due to the length of the waste line and the surface area exposure of liquids traveling through the waste line. In the present invention, as depicted in FIG. 1. The only significantly VOC exhaust of the present invention occurs when the individual pressure vessels 134 and 142 are exhausted during a liquid filling step. Owing to the size of the pressure vessels 134 and 142, only a small volume of VOC containing air is exhausted each time a pressure vessel is filled. Thus, the low quantity of VOCs generated by the present invention 10 is an attractive feature thereof.

While the invention has been described with regard to certain preferred embodiments, it will be understood by those skilled in the art that certain alterations and modifications thereof can be made without departing from the inventor features described herein. It is therefore intended that the following claims cover all such alterations and modifications that nevertheless include the true spirit and scope of the invention.

What I claim is:

1. A waste liquid collection and transfer system, comprising:
    at least one liquid waste transfer vessel having a liquid input valve and a liquid output valve, and being adapted to receive waste liquid;
    a pressurized gas liquid transfer system including at least one gas control valve for providing pressurized gas to said vessel;
    a waste liquid collection tank;
    a waste liquid drain line being engaged at one end thereof with said vessel and being engaged at another end thereof with said waste liquid collection tank;
    a liquid level alarm device being engaged with said tank and providing an alarm signal when a liquid level within said tank reaches a predetermined value;
    a system controller being electronically engaged to said alarm device and to said valves to control said valves to fill said vessel with waste liquid when said alarm signal is received by said system controller.

2. A system as described in claim 1, further including two liquid transfer vessels.

3. A system as described in claim 2, wherein said liquid input valve is electronically controlled by said system controller and adapted to supply input liquid to either of said vessels.

4. A system as described in claim 3 wherein said liquid output valve is electronically controlled by said system controller and adapted to supply output liquid from either of said vessels to said drain line.

5. A system as described in claim 2 wherein upon receipt of said alarm signal, said system controller first provides control signals to empty both said vessels to said tank, then closes said output valve to said tank, then controls said input valve to fill both said vessels, and then provides electronic signals to shut off waste liquid flowing to said liquid transfer vessels when both said vessels are full.

6. A system as described in claim 1 wherein said waste liquid drain line is closed except for an output opening at said waste liquid collection tank and input openings for receiving waste liquid from each said vessel.

7. A system as described in claim 1 wherein said liquid waste transfer vessel is disposed proximate a waste liquid producing tool, and wherein said system controller is disposed at a remote location from said vessel.

8. A system as described in claim 7 wherein said tool and said pressure vessel are located in a clean room facility, and said system controller is located outside of said clean room facility.

9. A system as described in claim 8 wherein a plurality of system controllers are located at an off-site facility, each said system controller providing control signals to at least one liquid waste transfer vessel.

10. A waste liquid collection and transfer system comprising:
    a plurality of liquid transfer devices, each said device being adapted to receive waste liquid from a waste liquid producing tool;
    each said liquid transfer device including at least one liquid transfer vessel having a liquid input valve and a liquid output valve, and being adapted to receive waste liquid from said tool;
    a waste liquid collection tank;
    a waste liquid drain line being engaged at one end thereof with said waste liquid collection tank and being further engaged with each said vessel to receive waste liquid therefrom;
    a system controller being electronically engaged to each said liquid transfer device to control the flow of waste liquid through each said vessel.

11. A system as described in claim 10 wherein each said liquid transfer device further includes a pressurized gas liquid transfer system including at least one gas control valve for providing pressurized gas to said vessel, said gas control valve being controlled by electronic signals from said system controller.

12. A system as described in claim 10 wherein said waste liquid drain line is closed except for an output opening at said waste liquid collection tank and input openings for receiving waste liquid from each said vessel.

13. A system as described in claim 10 wherein said waste liquid transfer vessel is disposed proximate a waste liquid producing tool, and wherein said system controller is disposed at a remote location from said vessel.

14. A system as described in claim 13 wherein said tool and said pressure vessel are located in a clean room facility, and said system controller is located outside of said clean room facility.

15. A system as described in claim 14 wherein a plurality of system controllers are located at an off-site facility, each said system controller providing control signals to at least one liquid waste transfer vessel.

16. A system as described in claim 10, further including a liquid level alarm device being engaged with said tank and providing an alarm signal when a liquid level within said tank reaches a predetermined value; said system controller being electronically engaged to said alarm device to control said valves to fill each said vessel waste liquid when alarm signal is received by said system controller.

17. A system as described in claim 16 wherein upon receipt of said alarm signal, said system controller first provides control signals to empy both said vessels to said tank, then closed said output valve to said tank, then controls said input valve to fill both vessels, and then provides electronic signals to shut off liquid flowing from said tool when both said vessels are full.

* * * * *